(12) United States Patent
Cheng et al.

(10) Patent No.: US 8,866,259 B2
(45) Date of Patent: Oct. 21, 2014

(54) INDUCTOR DEVICE AND FABRICATION METHOD

(71) Applicants:Jenhao Cheng, Shanghai (CN); Xining Wang, Shanghai (CN); Ling Liu, Shanghai (CN)

(72) Inventors: Jenhao Cheng, Shanghai (CN); Xining Wang, Shanghai (CN); Ling Liu, Shanghai (CN)

(73) Assignee: Semiconductor Manufacturing International Corp, Shanghai (CN)

( * ) Notice: Subject to any disclaimer, the term of this patent is extended or adjusted under 35 U.S.C. 154(b) by 76 days.

(21) Appl. No.: 13/690,267

(22) Filed: Nov. 30, 2012

(65) Prior Publication Data

US 2013/0328163 A1    Dec. 12, 2013

(30) Foreign Application Priority Data

Jun. 6, 2012    (CN) .......................... 2012 1 0184945

(51) Int. Cl.
*H01L 27/08*    (2006.01)
*H01L 49/02*    (2006.01)
*H01L 23/522*    (2006.01)

(52) U.S. Cl.
CPC ............ *H01L 28/10* (2013.01); *H01L 23/5227* (2013.01)

USPC .......................................................... 257/531

(58) Field of Classification Search
CPC ....................................................... H01L 28/10
USPC .......................................................... 257/531
See application file for complete search history.

(56) References Cited

U.S. PATENT DOCUMENTS

| | | | | |
|---|---|---|---|---|
| 2,843,829 | A * | 7/1958 | Slate .............................. | 336/200 |
| 6,864,581 | B1 * | 3/2005 | Hopper et al. ................ | 257/758 |
| 7,078,998 | B2 * | 7/2006 | Zhang et al. .................. | 336/200 |
| 7,791,165 | B2 * | 9/2010 | Tanaka .......................... | 257/531 |
| 7,977,767 | B2 * | 7/2011 | Nabeshima et al. .......... | 257/531 |
| 2002/0170743 | A1 * | 11/2002 | Boret ............................ | 174/250 |
| 2011/0156854 | A1 | 6/2011 | Lee | |

* cited by examiner

*Primary Examiner* — Lex Malsawma
(74) *Attorney, Agent, or Firm* — Anova Law Group, PLLC

(57) ABSTRACT

Various embodiments provide inductor devices and fabrication methods. In one embodiment, an inductor device can include a first dielectric layer disposed on a semiconductor substrate; a first planar spiral wiring disposed on the first dielectric layer, and optionally one or more second planar spiral wirings disposed over the first planar spiral wiring. Each of the first and the optional second planar spiral wirings can include a first spiral metal wiring and a second spiral metal wiring connected to the first spiral metal wiring. The second spiral metal wiring can include at least two sub-metal-lines isolated with one another.

17 Claims, 8 Drawing Sheets

INDUCTOR DEVICE AND FABRICATION METHOD

CROSS-REFERENCES TO RELATED APPLICATIONS

This application claims priority to Chinese Patent Application No. CN201210184945.4, filed on Jun. 6, 2012, the entire contents of which are incorporated herein by reference.

FIELD OF THE DISCLOSURE

The present disclosure relates to the field of semiconductor technology and, more particularly, relates to inductor devices and methods of fabricating high-performance inductor devices.

BACKGROUND

Integrated circuits (ICs), such as complementary metal-oxide-semiconductor (CMOS) radio frequency integrated circuit (RFIC), often employ passive components, such as resistors, capacitors, or inductors. Inductors may include planar spiral inductors made of metal wires disposed on surface of a substrate or a dielectric layer of an IC device. Planar spiral inductors typically have low noise and low power consumption and are easy for device integration with low cost. With downsizing of IC devices, there are challenges on process uniformity and stability.

FIGS. 1-2 depict a conventional inductor device. Specifically, FIG. 2 shows a top view of the inductor device. FIG. 1 shows a cross section along A-A' line of the device shown in FIG. 2.

As shown in FIG. 1, the device includes a spiral wiring 102 disposed on a dielectric layer 101. The dielectric layer 101 is disposed on a semiconductor substrate 100. The spiral wiring 102 has three rounds (or turns) of a metal wire with an inner radius of 45-50 μm. The metal wire has a width of 8-10 μm. The spiral wiring 102 has one end connected to an input contact point (pad) 103 and the other end connected to an output contact point (pad) 104 for current inputting and outputting of the device.

However, such planar inductor often has a low quality factor (Q), which may affect the performance of the planar inductor. There is a need to provide inductor devices with improved device quality factor and performance.

BRIEF SUMMARY OF THE DISCLOSURE

According to various embodiments, there is provided an inductor device. The inductor device can include a semiconductor substrate; a dielectric layer disposed on the semiconductor substrate; and a planar spiral wiring disposed on the dielectric layer. The planar spiral wiring can include a first spiral metal wiring and a second spiral metal wiring connected to a first end of the first spiral metal wiring. The second spiral metal wiring can include at least two sub-metal-lines isolated with one another. The inductor device can further include a first contact layer disposed on the dielectric layer. A second end of the first spiral metal wiring can be connected to the first contact layer.

According to various embodiments, there is also provided an inductor device. The inductor device can include a semiconductor substrate; a first dielectric layer disposed on the semiconductor substrate; a first planar spiral wiring disposed on the first dielectric layer; and one or more second planar spiral wirings disposed over the first planar spiral wiring. Each of the first and the one or more second planar spiral wirings can include a first spiral metal wiring and a second spiral metal wiring connected to the first spiral metal wiring. The second spiral metal wiring can include at least two sub-metal-lines isolated with one another and the first spiral metal wiring can include at least one sub-metal-line. The inductor device can also include a second dielectric layer disposed between adjacent layers of the first and the one or more second planar spiral wirings. The inductor device can further include a conductive plug disposed through an entire thickness of the second dielectric layer to connect the adjacent layers of the first and the one or more second planar spiral wirings such that the first planar spiral wiring is configured in series with the one or more second planar spiral wirings.

According to various embodiments, there is further provided a method of forming an inductor device by providing a semiconductor substrate; forming a first dielectric layer on the semiconductor substrate; and forming a first planar spiral wiring on the first dielectric layer. The first planar spiral wiring can be formed to include a first spiral metal wiring and a second spiral metal wiring connected to a first end of the first spiral metal wiring. The second spiral metal wiring can include at least two sub-metal-lines isolated with one another. The first spiral metal wiring can include at least one sub-metal-line.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Various embodiments provide inductor devices and their fabrication methods. In one embodiment, an inductor device can include a first dielectric layer disposed on a semiconductor substrate; a first planar spiral wiring disposed on the first dielectric layer, and optionally one or more second planar spiral wirings disposed over the first planar spiral wiring. Each of the first and the optional second planar spiral wirings can include a first spiral metal wiring, e.g., an outer spiral metal wiring (or an inner spiral metal wiring), and a second spiral metal wiring, e.g., an inner spiral metal wiring (or an outer spiral metal wiring), connected to the first spiral metal wiring. The second spiral metal wiring can include at least two sub-metal-lines isolated with one another.

Figure 1:
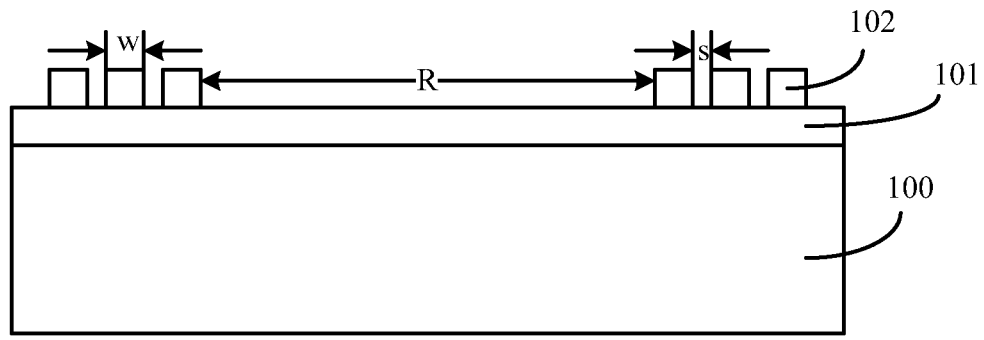
FIGS. 1-2 depict a conventional inductor device.
Figure 2:
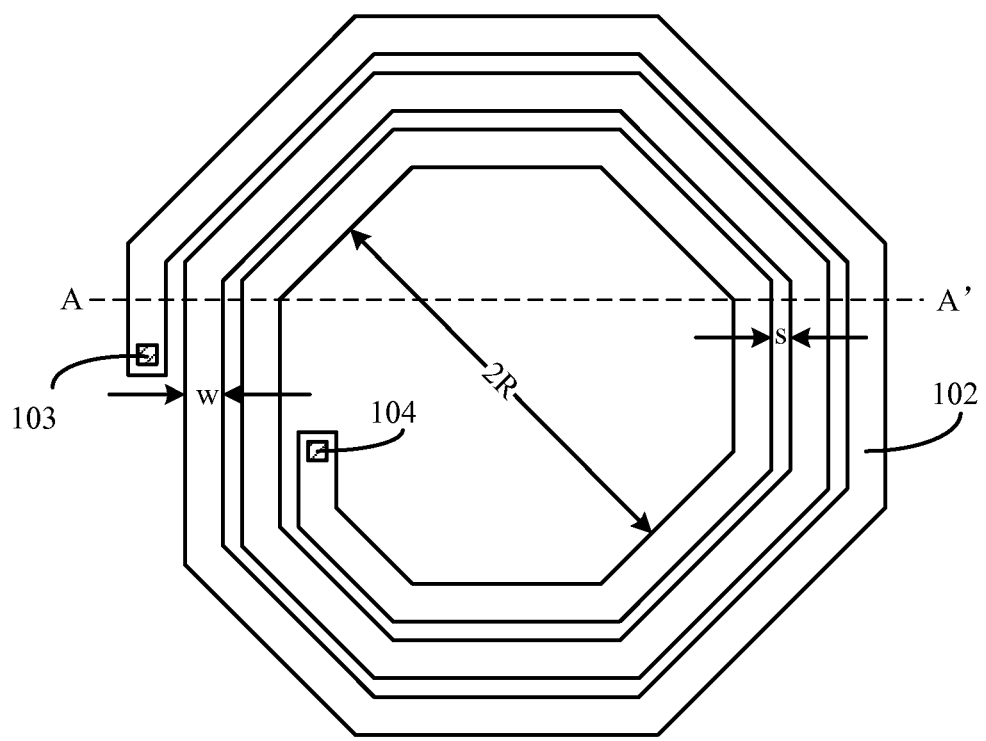
Figure 3:
FIG. 3 depicts a cross-sectional view of a first exemplary inductor device in accordance with various disclosed embodiments.
Figure 4:
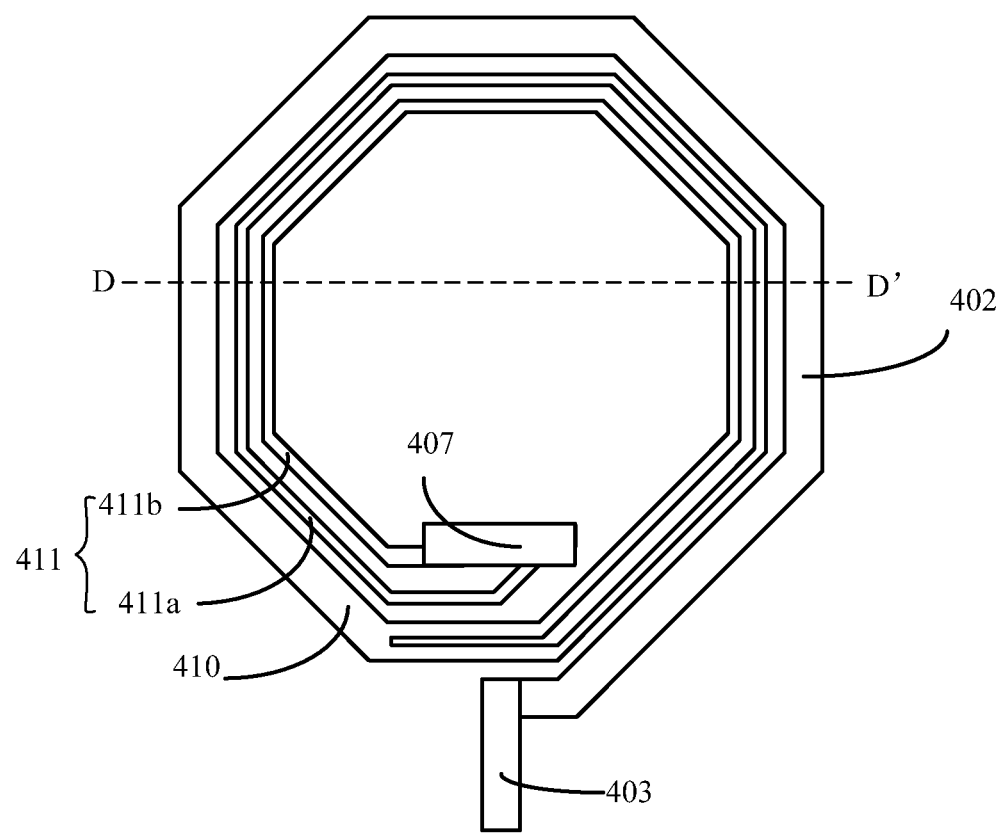
FIG. 4 depicts a top view of the first exemplary inductor device in FIG. 3 in accordance with various disclosed embodiments.

According to various embodiments, FIGS. 3-4 depict an exemplary inductor device. Specifically, FIG. 3 depicts a cross-sectional view along D-D' line of the device shown in FIG. 4. FIG. 4 depicts a top view of the exemplary inductor device. In one embodiment, the exemplary inductor device can be, e.g., an on-chip inductor device.

Referring to FIG. 3, the exemplary inductor device can include a semiconductor substrate 400, a dielectric layer 401 disposed over the semiconductor substrate 400, and a planar spiral wiring 402 disposed over the dielectric layer 401.

Referring to FIG. 4, the planar spiral wiring 402 can include an outer spiral metal wiring 410 and a second spiral metal wiring 411 connected to the outer spiral metal wiring 410. The second spiral metal wiring 411 can include, for example, at least two sub-metal-lines such as the sub-metal-lines 411a-b. The at least two sub-metal-lines can be isolated from one another and can include, for example, about 2 to about 10 sub-metal-lines.

The device shown in FIGS. 3-4 also includes a first contact layer 403 and a second contact layer 407 disposed over the dielectric layer 401. The outer spiral metal wiring 410 can be connected to the first contact layer 403. The outer spiral metal wiring 410 can also be connected to the second spiral metal wiring 411 including at least two sub-metal-lines 411a-b. The second spiral metal wiring 411 including at least two sub-metal-lines 411a-b can also be connected to the second contact layer 407 formed over/on the dielectric layer 401.

The semiconductor substrate 400 can provide a working platform and can be made of a material including, but not limited to, silicon (Si), silicon germanium (SiGe), silicon carbide (SiC), silicon on insulator (SOI), silicon nitride ($Si_xN_y$), and/or a Group III-V substrate, such as, for example, gallium arsenide (GaAs), indium phosphide (InP), and/or gallium nitride (GaN).

The dielectric layer 401 can be made of a material including, e.g., silicon oxide and/or silicon nitride. The dielectric layer 401 can be disposed to isolate the planar spiral wiring 402 and the semiconductor substrate 400.

The planar spiral wiring 402 can have an inner radius ranging from about 5 µm to about 200 µm, for example, from about 5 µm to about 100 µm. The planar spiral wiring 402 can be made of a material including, for example, copper and/or aluminum. The planar spiral wiring 402 can have a thickness ranging from about 0.05 µm to about 10 µm, for example, from about 0.1 µm to about 5 µm. The planar spiral wiring 402 can be configured having a shape including, for example, a quadrilateral, hexagonal, octagonal, and/or round shape.

In various embodiments, the at least two sub-metal-lines of the second spiral metal wiring 411 can be, for example, about 2 to about 10 sub-metal-lines. The outer spiral metal wiring 410 can include, for example, at least one sub-metal-line, such as about 1 to about 10 sub-metal-lines. Distance between adjacent isolated sub-metal-lines can be about 0.001 µm to about 100 µm, for example, about 1 µm to about 20 µm. The sub-metal-lines can have a width of about 0.001 µm to about 100 µm, for example, about 1 µm to about 20 µm.

In a certain embodiment, the planar spiral wiring 402 can be made of copper. The planar spiral wiring 402 can have an octagonal shape and a thickness of about 0.05 µm to about 10 µm, for example, about 3 µm to about 4 µm. The second spiral metal wiring 411 including isolated sub-metal-lines 411a-b can be configured having one or more rounds, for example, having one round of spiral wiring as shown in FIG. 4. In a certain embodiment, the second spiral metal wiring 411 can have an inner radius or an equivalent width ranging from about 5 µm to about 200 µm, for example, from about 25 µm to about 30 µm. The sub-metal-lines 411a-b can have a width of about 0.001 µm to about 100 µm, for example, about 3 µm, and thus provides low parasitic capacitance. The outer spiral metal wiring 410 can include, e.g., a single conductive wire having a width greater than the width of the sub-metal-lines 411a-b. As shown in FIG. 4, in a same planar layer of the planar spiral wiring 402, the outer spiral metal wiring 410 can surround the second spiral metal wiring 411 as an inner spiral metal wiring having the above-discussed inner radius. In certain embodiments, a distance between adjacent components of the outer spiral metal wiring 410 and the sub-metal-lines 411a-b can be about 0.001 µm to about 100 µm, for example, about 3 µm.

It should be noted that the devices depicted in FIGS. 3-4 can provide low resistance and low parasitic capacitance. Device quality factor can thus be increased and performance of the inductor device can be improved. The quality factor of an inductor device is the ratio of its inductive reactance to its resistance at a given frequency, and is a measure of its efficiency. The higher the quality factor of the inductor device, the closer it approaches the behavior of an ideal lossless inductor. The quality factor can be affected by, for example, resistance of metal wire in the inductor spiral wiring, and/or parasitic capacitance at overlapping areas (or contact areas) between the inductor spiral wire and a semiconductor substrate (or a top or bottom adjacent metal layer). For example, the higher resistance (and/or the higher parasitic capacitance), the lower quality factor and the poorer device performance. To improve the quality factor and device performance, the width of the metal wire may be increased, so that the current density in the metal wire increases, thereby reducing resistance of the metal wire. However, when the width increases, the overlapping area between the metal wire and adjacent components may also be increased. Related parasitic capacitance may be increased as well. Certain approaches (e.g., FIGS. 3-4) may be used to reduce the overlapping area.

For example, referring back to FIG. 4, the sub-metal-lines 411a-b are configured in parallel, i.e., the sub-metal-lines 411a-b are both connected to the second contact layer 407 and the outer spiral metal wiring 410, which reduces resistance of the planar spiral wiring 402. In addition, the sub-metal-lines 411a-b can be controlled to be small enough to provide a small overlapping area with adjacent components/layers including, e.g., the semiconductor substrate 400 and metal layers formed above or under the sub-metal-lines. Parasitic capacitance of the sub-metal-lines 411a-b can thus be reduced.

On the other hand, the outer spiral metal wiring 410 configured by a single metal wire can provide the planar spiral wiring 402 with a low resistance as compared with multiple-wire configurations, although multiple-wire configurations of the outer spiral metal wiring 410 are encompassed herein according to various embodiments. Such low resistance may allow thick copper wires to be used for the planar spiral wiring 402. Further, the outer spiral metal wiring 410 can have large width for providing large current density in the outer spiral metal wiring 410. Furthermore, the quality factor of the inductor device can be controlled by controlling the number, dimensions (e.g., width, thickness, etc.) and/or material used for each of the outer spiral metal wiring 410 and/or sub-metal-line(s) 411a-b of the second spiral metal wiring 411 of the planar spiral wiring 402.

Figure 5:
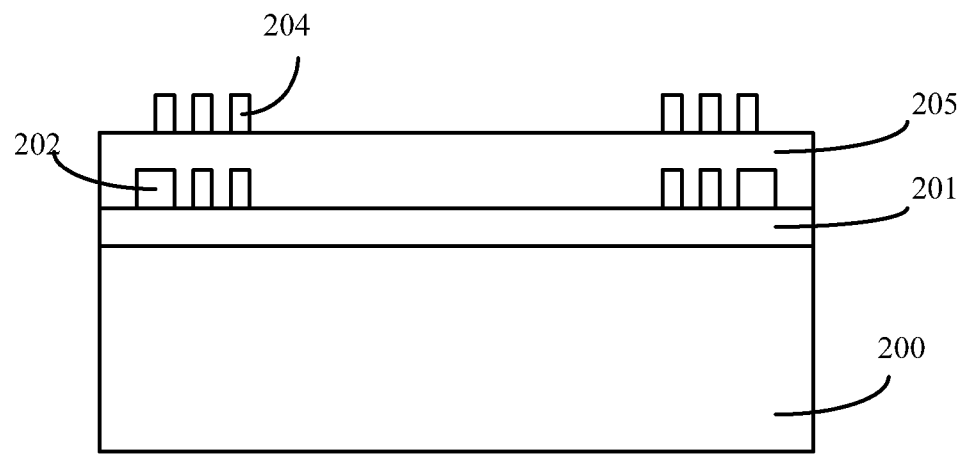
FIG. 5 depicts a cross-sectional view of a second exemplary inductor device in accordance with various disclosed embodiments.
Figure 6:
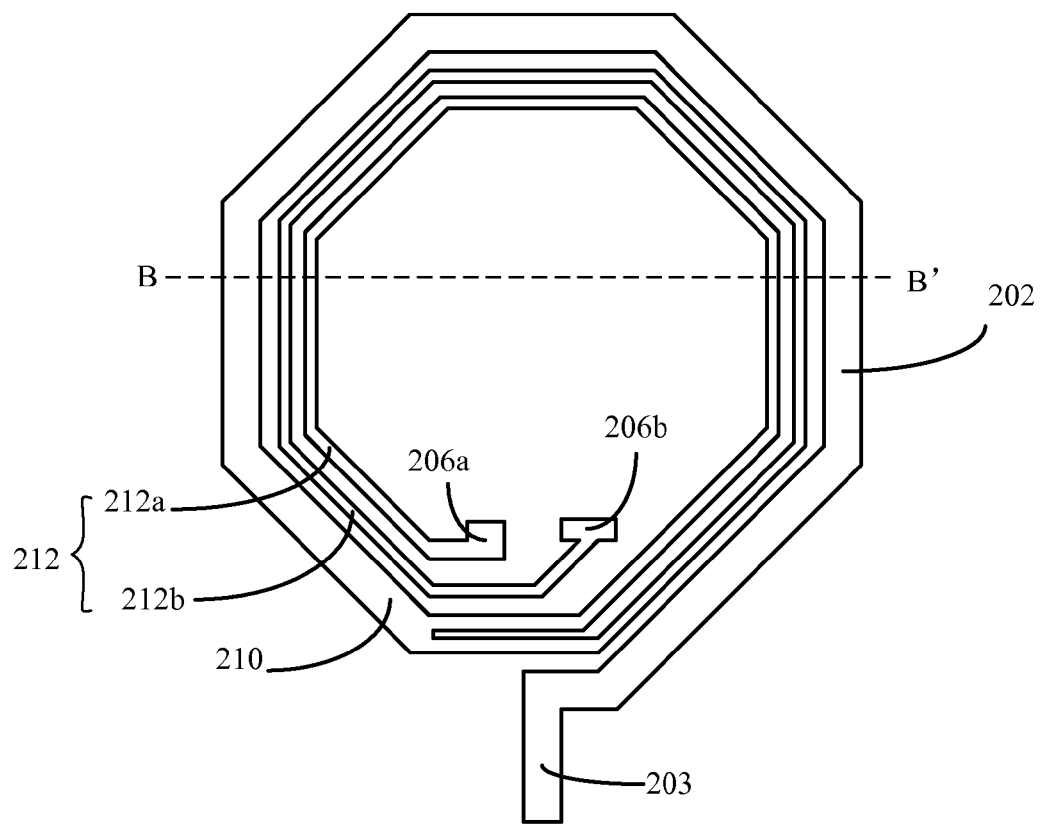
FIG. 6 depicts a top view of a first planar spiral wiring of the second exemplary inductor device of FIG. 5 in accordance with various disclosed embodiments.
Figure 7:
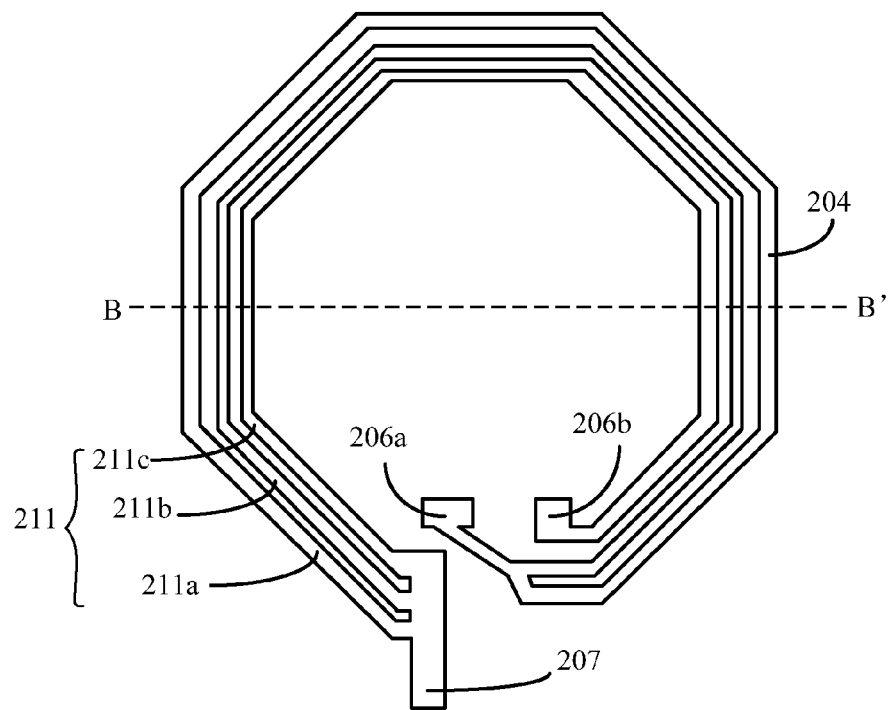
FIG. 7 depicts a top view of a second planar spiral wiring of the second exemplary inductor device of FIG. 5 in accordance with various disclosed embodiments.

FIGS. 5-7 depict another exemplary inductor device including, for example, multiple layers of planar spiral wirings. Specifically, FIG. 5 depicts a cross-sectional view of the exemplary inductor device having a first and second planar spiral wirings; FIG. 6 depicts a top view of the first planar spiral wiring; and FIG. 7 depicts a top view of the second planar spiral wiring of the exemplary inductor device in FIG. 5. The cross-sectional view in FIG. 5 is along B-B' line of the top views depicted in FIGS. 6-7.

As shown in FIG. 5, the exemplary inductor device can include a semiconductor substrate 200; a first dielectric layer 201 disposed over the semiconductor substrate 200; a first planar spiral wiring 202 disposed over the first dielectric layer 201; a second planar spiral wiring 204 disposed over the first planar spiral wiring 202; and a second dielectric layer 205 disposed between the first and the second planar spiral wirings 202 and 204.

As shown in FIG. 6, the first planar spiral wiring 202 can include an outer spiral metal wiring 210 and a second spiral metal wiring 212 connected to the outer spiral metal wiring 210. In embodiments, the first planar spiral wiring 202 can be configured to be the same as or different from the planar spiral wiring 402 as depicted in FIGS. 3-4. For example, the first planar spiral wiring 202 can be configured similarly to the planar spiral wiring 402, except that one end of each of the sub-metal-lines (e.g., 212a-b) can be connected to a respective contact layer (e.g., 206a or 206b) instead of having both of sub-metal-lines (e.g., 212a-b) connecting to the same contact layer (e.g., 407 in FIG. 4). The second spiral metal wiring 212 can include at least two sub-metal-lines 212a-b isolated from one another. One end of the sub-metal-lines 212a-b of the second spiral metal wiring 212 can be connected to the outer spiral metal wiring 210. The outer spiral metal wiring 210 can further be connected to a first contact layer 203. The first contact layer 203 can be disposed over/on the first dielectric layer 201.

As shown in FIG. 7, the second planar spiral wiring 204 can include a spiral metal wiring 211, e.g., formed by about 1-10 isolated sub-metal-lines, such as the sub-metal-lines 211a, 211b, and/or 211c in FIG. 7. The conductive plugs 206a and 206b configured through the entire thickness of the second dielectric layer 205 can connect the first and second planar spiral wirings 202 and 204 such that planar spiral wirings 202 and 204 are configured in series. Because the first planar spiral wiring 202 and the second planar spiral wiring 204 are connected in series through the conductive plugs 206a-b, the effective area of the first and second planar spiral wirings 202 and 204 can be reduced, e.g., by more than about 50%, without sacrificing length of the planar spiral wirings 202 and 204. Operational frequency of the exemplary inductor device can be maintained within a desired range, for example, about 1 GHz to about 6 GHz. In addition, the reduced effective area of the inductor device can facilitate device integration. In one example, the effective area of an exemplary inductor device can be less than about 70×70 µm².

On the second dielectric layer 205, there is a second contact layer 207, as shown in FIG. 7. The planar spiral wiring 204 containing sub-metal-lines 211a-c can be connected to the second contact layer 207 at one end of the sub-metal-lines 211a-c.

In various embodiments, the semiconductor substrate 200 can be the same as or different from the semiconductor substrate 400 as depicted in FIGS. 3-4. The dielectric layers 201 and 205 can be made of a material including silicon oxide, silicon nitride, and/or other dielectric material(s). The first dielectric layer 201 can be used to isolate the first planar spiral wiring 202 and the semiconductor substrate 200. The second dielectric layer 205 can be used to isolate the first and second planar spiral wirings 202 and 204. In one embodiment, both the second dielectric layer 205 and the first planar spiral wiring 202 can be formed on surface of and/or within the first dielectric layer 201.

In certain embodiments, the first planar spiral wiring 202 and/or the second planar spiral wiring 204 can have an inner radius of about 5 µm to about 200 µm, for example, about 5 µm to about 100 µm. The first planar spiral wiring 202 and/or the second planar spiral wiring 204 can be formed of a material including copper, aluminum, and/or other conductive materials. The first planar spiral wiring 202 and/or the second planar spiral wiring 204 can have a thickness ranging from about 0.05 µm to about 10 µm, for example, about 0.1 µm to about 5 µm and/or a shape including such as a quadrilateral, hexagonal, octagonal, and/or round shape. Adjacent isolated sub-metal-lines can be spaced apart by a distance ranging from about 0.001 µm to about 100 µm, for example, from about 1 µm to about 20 µm. Each of the sub-metal-lines can have a width of about 0.001 µm to about 100 µm, for example, about 1 µm to about 20 µm.

In one embodiment, the first planar spiral wiring 202 can be made of copper. The first planar spiral wiring 202 can be in an octagonal shape and have a thickness of about 0.05 µm to about 10 µm, for example, about 3 µm to about 4 µm. The first planar spiral wiring 202 can include one round of spiral wiring formed by isolated sub-metal-lines 212a-b. The first planar spiral wiring 202 can have an inner radius or an equivalence ranging from about 5 µm to about 200 µm, for example, from about 25 µm to about 30 µm. The sub-metal-lines 212a-b can have a width of about 0.001 µm to about 100 µm, for example, about 3 µm. The sub-metal-line 212a can be connected to the conductive plug 206a. The sub-metal-line 212b can be connected to the conductive plug 206b. The sub-metal-lines 212a-b can further be connected to the outer spiral metal wiring 210 of the planar spiral wiring 202. The outer spiral metal wiring 210 can be a single wire having a width greater than the width of sub-metal-lines 212a-b. The sub-metal-lines 212a-b can be spaced apart from the outmost spiral metal wiring 210 for about 3 µm. The outmost spiral metal wiring 210 can also be connected to the first contact layer 203.

In one embodiment, the second planar spiral wiring 204 of the device shown in FIG. 7 can include an octagonal shape. The second planar spiral wiring 204 can be made of aluminum and have a thickness of about 0.05 µm to about 10 µm, for example, about 1.4 µm to about 3 µm. The second planar spiral wiring 204 can include one round of a metal wire. The second planar spiral wiring 204 can have an inner radius or an equivalence ranging from about 5 µm to about 200 µm, for example, from about 25 µm to about 30 µm.

It should be noted that because the second planar spiral wiring 204 can be made of aluminum having a lower resistance than, e.g., copper. The second planar spiral wiring 204 can include more rounds of spiral wiring than the first planar spiral wiring 202. For example, the second planar spiral wiring 204 can include isolated sub-metal-lines 211a-c each having a width of about 0.001 µm to about 100 µm, for example, about 3 µm. Among them, the sub-metal-lines 211a-b can be connected to the conductive plug 206a, while the sub-metal-line 211c can be connected to the conductive plug 206b. Each of the sub-metal-lines 211a-c can further be connected to the second contact layer 207. The sub-metal-lines 211a-c can have a small width and thus a low parasitic capacitance.

In the example shown in FIG. 7, the sub-metal-lines 211a-b can be configured in parallel between the contact layer 207 and the conductive plug 206a. The sub-metal-line 211c in FIG. 7 can be configured in series with the sub-metal-line 212b shown in FIG. 6 by the conductive plug 206b. As such, sub-metal-lines between the contact layer 203 of the first planar spiral wiring 202 and the contact layer 207 of the second planar spiral wiring 204 can be configured in parallel. Resistance of the exemplary inductor device can then be reduced.

When the inductor device is in operation, current crowding effect may accumulate carriers in the inner spiral wiring of the sub-metal-line 212a (FIG. 6) and the sub-metal-line 211c (FIG. 7) due to electromagnetic attraction. This may result in increasing of resistance and reducing of quality factor of the device. By connecting the inner sub-metal-line 212a of the first planar spiral wiring 202 with the outer sub-metal-lines 211a-b of the second planar spiral wiring 204 via the conductive plug 206a and by connecting the sub-metal-line 212b of the first planar spiral wiring 202 with the inner sub-metal-line 211c of the second planar spiral wiring 204 via the conductive plug 206b, the disclosed configurations can allow carriers that are accumulated in the inner spiral wiring to be dispersed into the outer spiral wiring of the planar spiral wirings to reduce resistance.

Although not illustrated in FIGS. 6-7, in other embodiments, the conductive plug 206a can connect the inner sub-metal-line 212a of the first planar spiral wiring 202 with the sub-metal-lines 211c of the second planar spiral wiring 204, while the conductive plug 206b can connect the inner sub-metal-line 212b of the first planar spiral wiring 202 with the sub-metal-lines 211a-b of the second planar spiral wiring 204, to form a desired inductor device.

It should be noted that when the quality factor of the first planar spiral wiring 202 and the quality factor of the second planar spiral wiring 204 are at a comparable level, e.g., with a difference at a range of approximately 1-5, the inductor device formed by the first planar spiral wiring 202 and second planar spiral wiring 204 configured in series can have high quality factor and high device performance. Of course, quality factor of the inductor device can be adjusted by controlling the number, dimensions (e.g., width, thickness, etc.) and/or material used for each of the sub-metal-lines configured within the first and second planar spiral wirings 202 and 204. For example, when increasing the line width or number of the sub-metal-lines, device quality factor can be increased.

In some embodiments, the second planar spiral wiring 204 can include, e.g., about 5 sub-metal-lines (not illustrated). For example, two innermost sub-metal-lines of the five sub-metal-lines can be connected to the sub-metal-line 212b of the first planar spiral wiring 202 in FIG. 6 via the conductive plug 206b. The other three outer sub-metal-lines of the five sub-metal-lines can be connected to the sub-metal-line 212a of the first planar spiral wiring 202 in FIG. 6 via the conductive plug 206a. By this configuration, quality factor of the second planar spiral wiring 204 can be improved.

As such, the sub-metal-lines included in the first and second planar spiral wirings 202 and 204 connecting the first contact layer 203 and the second contact layer 207 are configured in parallel, while the first planar spiral wiring 202 and a second planar spiral wiring 204 are connected in series (i.e., the sub-metal-lines can be connected in serial configuration, in parallel configuration, and in a mixed serial and parallel configurations). Such configurations can provide reduced resistance. In addition, the width of each of the sub-metal-lines can be reduced to provide reduced overlapping area with adjacent layers. Parasitic capacitance can thus be improved. Further, while the overlapping area is reduced, the entire length of sub-metal-lines can be maintained so that the inductance frequency can be controlled to be within the desired scope.

Figure 8:
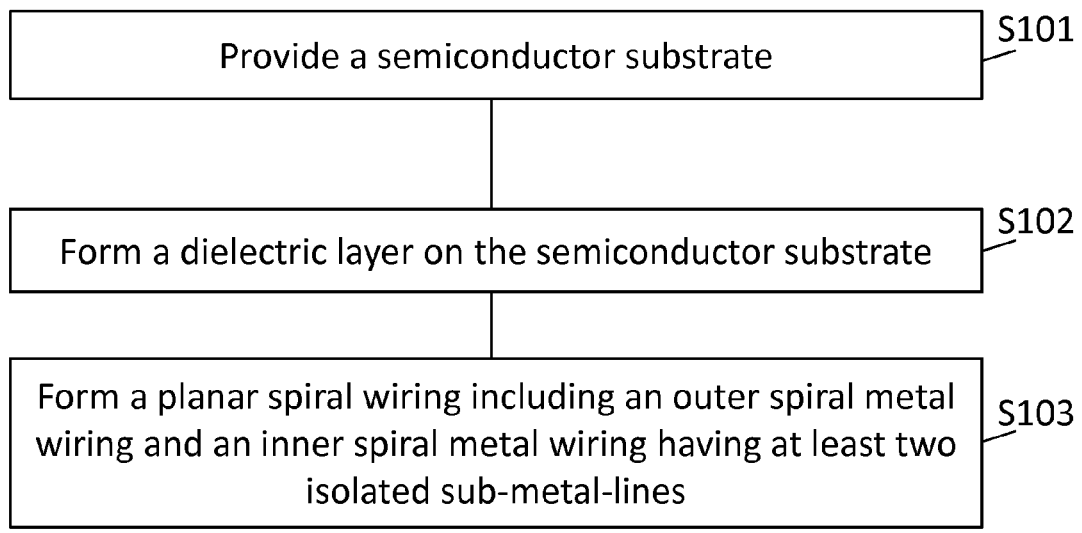
FIG. 8 depicts a method for making a third exemplary inductor device in accordance with various disclosed embodiments.
Figure 9:
FIGS. 9-10 and 12-13 depict cross-sectional views of the third exemplary inductor device at various stages during the formation of FIG. 8 in accordance with various disclosed embodiments.
Figure 10:
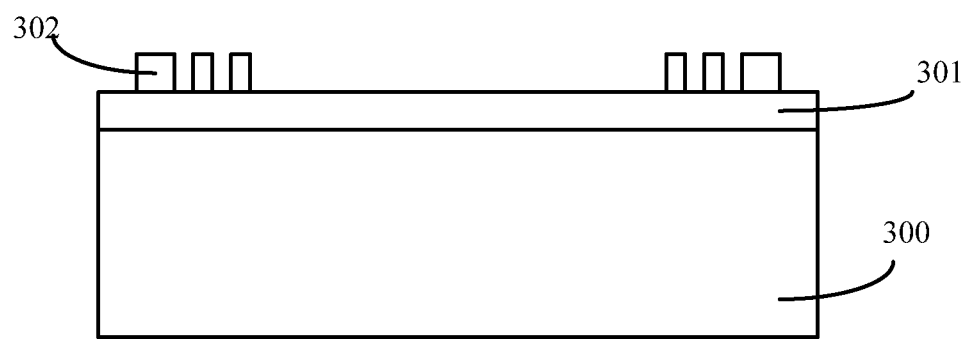
Figure 11:
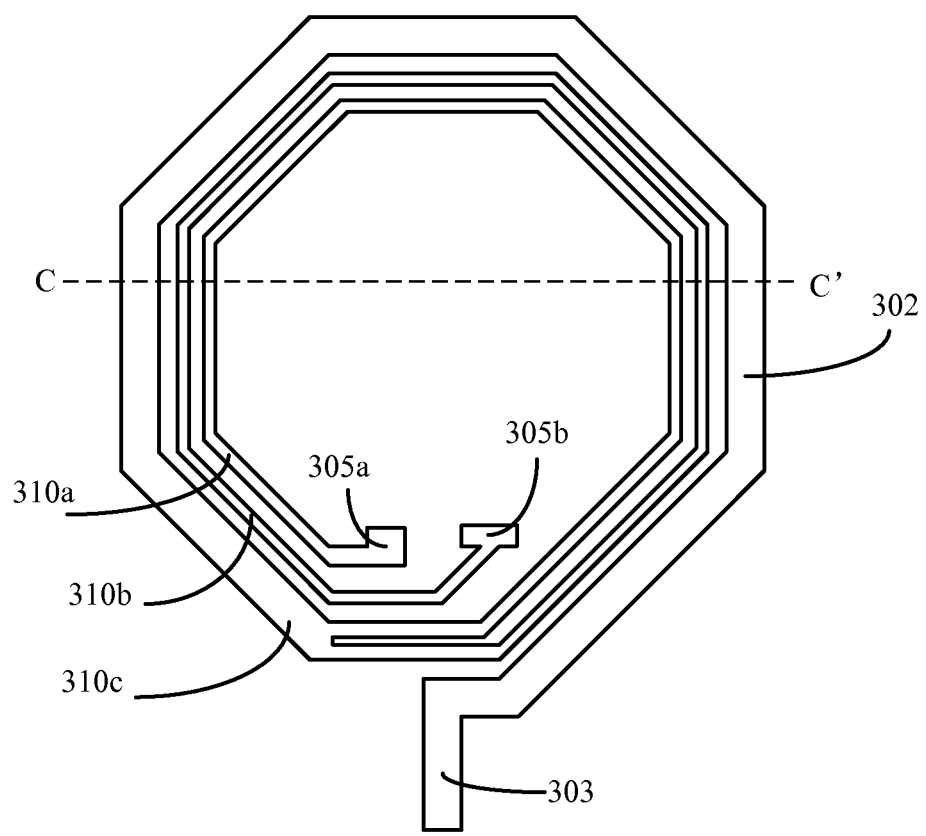
FIG. 11 depicts a top view of the inductor device shown in FIG. 10 in accordance with various disclosed embodiments.
Figure 12:
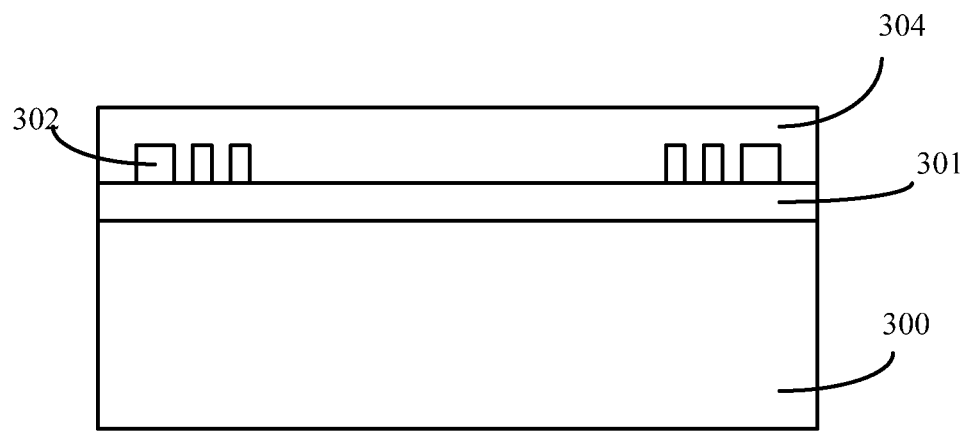
Figure 13:
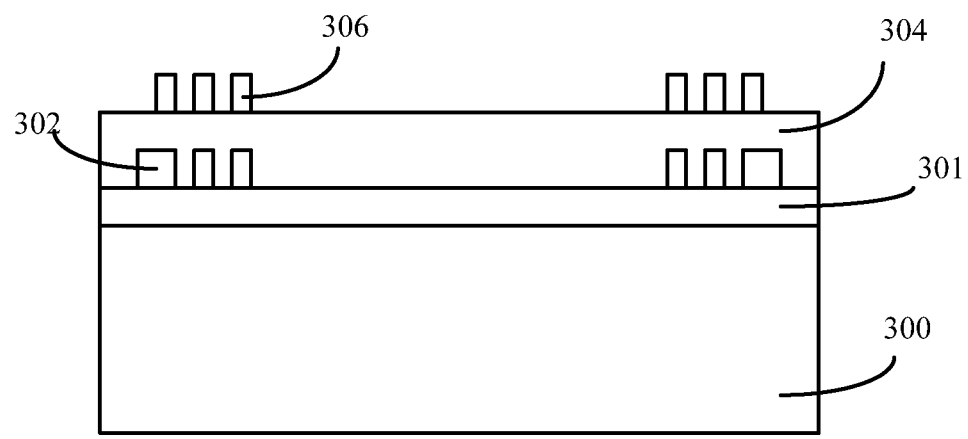
Figure 14:
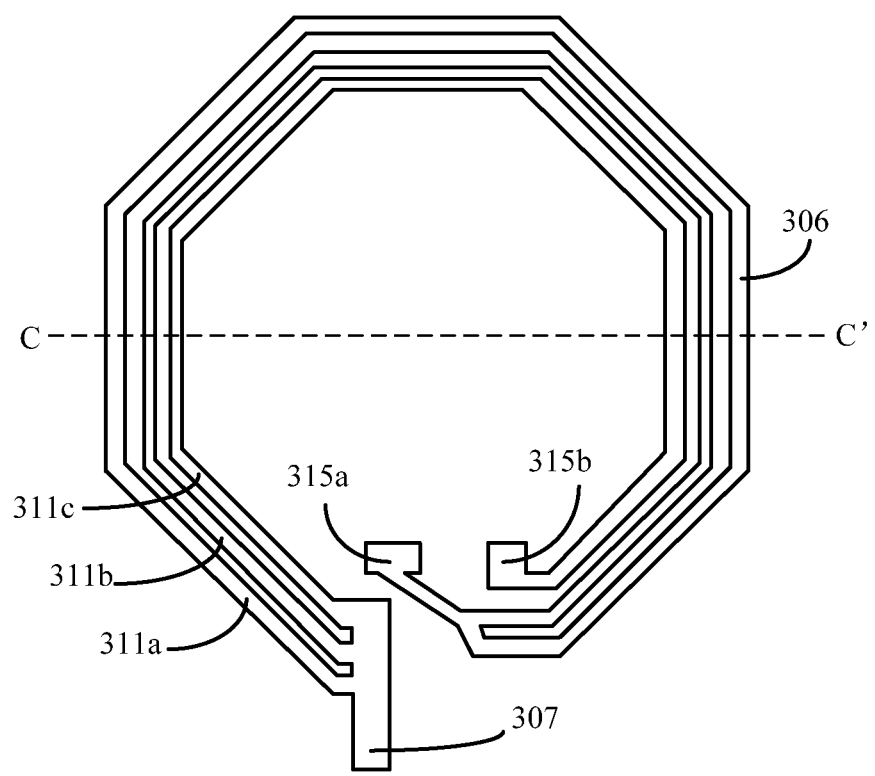
FIG. 14 depicts a top view of the inductor device shown in FIG. 13 in accordance with various disclosed embodiments.

FIGS. 8-14 depict another exemplary inductor device and method of making the exemplary inductor device. Specifically, FIG. 8 depicts an exemplary method for making an exemplary inductor device as disclosed herein. FIGS. 9-10 and 12-13 depict cross-sectional view of the exemplary inductor device at various stages during the formation as depicted in FIG. 8. FIG. 11 depicts a top view of the cross-sectional view shown in FIG. 10 along the line of C-C'. FIG. 14 depicts a top view of the cross-sectional view shown in FIG. 13 along the line of C-C'.

At step S101 in FIG. 8 and referring to FIG. 9, a semiconductor substrate 300 can be provided. The semiconductor substrate 300 can be similar to or different from the semiconductor substrate 400 in FIG. 3 and/or the semiconductor substrate 200 in FIG. 5.

At step S102 in FIG. 8 and referring to FIG. 9, a first dielectric layer 301 can be formed on the semiconductor substrate 300. The first dielectric layer 301 can be the same as or different from the dielectric layer 401 in FIG. 3 and/or the dielectric layers 201 and 205 in FIG. 5. In one example, the first dielectric layer 301 can be deposited by, for example, chemical vapor deposition, or other suitable deposition process.

Note that during formation of the disclosed inductor device, e.g., before forming the first dielectric layer 301 on the semiconductor substrate 300, other IC structures/devices can be formed simultaneously or sequentially on the semiconductor substrate 300.

In some cases, a dummy metal layer may be formed over the semiconductor substrate 300 for temporal protection and then removed after formation of the inductor device to facilitate stable operation of the inductor device. However, parasitic capacitance can be formed between the dummy metal layer and the subsequently formed planar spiral wiring to reduce quality factor of the device. As disclosed herein, there is no need to form the dummy metal layer before forming the dielectric layer 301 due to the reduced effective area of inductor device. In other words, the dummy metal layer can be eliminated from the process due to the reduced effective area of the inductor device. The surface uniformity of the semiconductor substrate 300 can be provided by a planarization process (e.g., a chemical mechanical planarization) prior to forming the first dielectric layer 301. Quality factor can at least be maintained.

At step S103 in FIG. 8 and referring to FIGS. 10-11, a first planar spiral wiring 302 can be formed on the first dielectric layer 301. The first planar spiral wiring 302 can include an outer spiral metal wiring 310c and a second spiral metal wiring including at least two isolated sub-metal-lines 310a-b. The first planar spiral wiring 302 can be formed by, e.g., standard photolithography. In one example, the first planar spiral wiring 302 can be formed by first forming (e.g., depositing) a metal layer on the first dielectric layer 301; then forming a photoresist layer on the metal layer to define position of the first planar spiral wiring 302 to be formed; and then using the photoresist layer as a mask to etch the metal layer to form the first planar spiral wiring 302.

In one embodiment, the first planar spiral wiring 302 can be made of copper having an octagonal shape. The first planar spiral wiring 302 can have a thickness of about 0.05 µm to about 10 µm, for example, about 3 µm to about 4 µm. The first planar spiral wiring 302 can have an inner radius ranging from about 5 µm to about 200 µm, for example, from about 25 µm to about 30 µm, formed by the innermost sub-metal-lines 310a, for example. One end of the sub-metal-line 310a can be connected to the contact layer 305a, while the other end of the sub-metal-line 310a can be connected to the outer sub-metal-line 310c. The contact layer 305a can further be connected to a subsequently-formed conductive plug. Likewise, one end of the sub-metal-lines 310b can be connected to the contact layer 305b, while the other end of the sub-metal-lines 310b can be connected to the outer sub-metal-line 310c. The contact layer 305b can further be connected to a subsequently-formed conductive plug. The inner sub-metal-lines 310a and 310b as shown in FIG. 11 can have a width of about 0.001 µm to about 100 µm, for example, about 3 µm.

The outer sub-metal-line 310c can be a single wire having a width greater than the sub-metal-lines 310a and 310b. The sub-metal-lines 310a and 310b and the outer sub-metal-line 310 can be spaced apart for about 3 µm. The outer sub-metal-line 310c can further be connected to the first contact layer 303 as shown in FIG. 11.

Referring to FIG. 12, a second dielectric layer 304 can be formed on the first planar spiral wiring 302 and on the first dielectric layer 301. The second dielectric layer 304 can be formed by a similar process for forming the first dielectric layer 301. The second dielectric layer 304 can be used to isolate the first planar spiral wiring 302 and a subsequently formed second planar spiral wiring 306, as shown in FIG. 13.

Conductive plugs (not illustrated) can be formed through the second dielectric layer 304. For example, as shown in FIG. 11, the sub-metal-line 310a can be connected to a first conductive plug via the contact layer 305a, while the sub-metal-line 310b can be connected to a second conductive plug via the contact layer 305b. Conductive plugs can be formed by a process including, for example, forming an opening through the thickness of the second dielectric layer 304 to expose a surface of the contact layer 305a and 305b; filling metal in the through-opening; and planarizing a top surface including the filled metal and the second dielectric layer 304.

Referring to FIGS. 13-14, a second planar spiral wiring 306 can be formed on the second dielectric layer 304. The second planar spiral wiring 306 can be formed by a similar process for forming the first planar spiral wiring 302. In certain embodiments, the second planar spiral wiring 306 can be made of aluminum having a thickness of about 0.05 µm to about 10 µm, for example, about 1.4 µm to about 3 µm. The second planar spiral wiring 306 can include isolated sub-metal-lines 311a, 311b and 311c each having a width of about 0.001 µm to about 100 µm, for example, about 3 µm. The second planar spiral wiring 306 can have an innermost sub-metal-line 311c having an inner radius of about 5 µm to about 200 µm, for example, about 25 µm to about 30 µm. The second planar spiral wiring 306, including sub-metal-lines 311a, 311b and 311c, can be octagonal shaped and include a single round of metal wiring. One end of the sub-metal-lines 311a, 311b and 311c can be connected to the second contact layer 307, while the other end of the sub-metal-lines 311a-b can be connected to a contact layer 315a with the other end of the sub-metal 311c connected to a contact layer 315b, as shown in FIG. 14. As such, the first planar spiral wiring 302 and the second planar spiral wiring 306 are configured in series. Resistance of the inductor device can be reduced to improve quality factor.

The contact layer 315a in FIG. 14 can be connected to the contact layer 305a in FIG. 11 via a first conductive plug (not illustrated). The contact layer 315b in FIG. 14 can be connected to the contact layer 305b in FIG. 11 via a second conductive plug. Sub-metal-lines connecting the first contact layer 303 in FIG. 11 with the second contact layer 307 in FIG. 14 can be configured in parallel.

As disclosed herein, sub-metal-lines can be configured in parallel between device input and output such that resistance in the planar spiral wirings can be reduced to improve quality factor. In addition, the second spiral metal wiring of the planar spiral wirings can include at least two isolated sub-metal-lines. Width of the second spiral metal wiring can be reduced to reduce parasitic capacitance between adjacent components. Quality factor of the inductor device can be increased. In some embodiments, overlapping arrangement of the planar spiral wirings, e.g., configured in series, can provide a reduced effective area without scarifying wiring length (and thus the inductance frequency). The inductor device can be integrated with reduced effective area and can be operated at required inductance frequency.

In certain embodiments, the first and second planar spiral wirings can be made of copper and have a thickness of about 0.05 µm to about 10 µm, for example, about 3 µm to about 4 µm. The spiral metal wirings can be made of a single wire and have a large width. Current density can be increased. Device quality factor can be improved.

In some embodiments, the inner sub-metal-line (e.g., of the first planar spiral wiring) can be connected to an outer sub-metal-line (e.g., of the second planar spiral wiring) via a conductive plug. This can avoid resistance increasing due to carrier accumulation caused by inductance crowding effect in the inner round of metal wiring of the first or the second planar spiral wirings. In fact, such dispersion of carriers can reduce resistance and improve device quality factor.

In various disclosed embodiments, although FIGS. 3-4, FIGS. 5-7, and FIGS. 8-14 depict exemplary inductor devices having one or two planar spiral wirings, one of ordinary skill in the art would understand that the disclosed inductor device can include three, four, five, or more planar spiral wirings, e.g., separated by dielectric layer(s). The number, dimensions (e.g., width, thickness, etc.) and/or material used for each of the sub-metal-lines configured within the planar spiral wiring(s) can be controlled to provide desired device performance. The method disclosed herein, e.g., as depicted in FIG. 8, can be adapted and/or altered to form various exemplary inductor devices.

For example, a plurality of second planar spiral wirings can be formed over the first planar spiral wiring. Each second planar spiral wiring can include an outer spiral metal wiring and a second spiral metal wiring connected to the outer spiral metal wiring. The second spiral metal wiring can include at least two sub-metal-lines isolated with one another. The outer spiral metal wiring can include at least one sub-metal-line. Between adjacent layers of the first and second planar spiral wirings, a second dielectric layer can be formed and can include a conductive plug formed through the entire thickness of the second dielectric layer. The first planar spiral wiring can be configured in series with the second planar spiral wirings. For example, an inner sub-metal-line of one of the first and second spiral metal wirings can be connected to an outer sub-metal-line of an adjacent spiral metal wiring. In another example, a contact layer can be formed on one of the second dielectric layers that is formed on a top layer of the second spiral metal wirings. The outmost spiral metal wiring in such top layer can be connected to this contact layer.

Other applications, advantages, alternations, modifications, or equivalents to the disclosed embodiments are obvious to those skilled in the art.

What is claimed is:

1. An inductor device comprising:
   a semiconductor substrate;
   a dielectric layer disposed on the semiconductor substrate;
   a planar spiral wiring disposed on the dielectric layer, the planar spiral wiring including a first spiral metal wiring and a second spiral metal wiring connected to a first end of the first spiral metal wiring, wherein the second spiral metal wiring includes at least two sub-metal-lines isolated with one another;
   a first contact layer disposed on the dielectric layer and connected to a second end of the first spiral metal wiring; and
   a second contact layer coupled to only at an end of the second spiral metal wiring, such that the at least two isolated sub-metal-lines of the second spiral metal wiring are in a parallel configuration between the second contact layer and the first spiral metal wiring,
   wherein, in a same planar layer, the first spiral metal wiring and, the second spiral metal wiring including the parallel configuration of the at least two isolated sub-metal-lines, are configured in series between the first contact layer and the second contact layer.

2. The device of claim 1, wherein the at least two sub-metal-lines include about 2 to about 10 isolated sub-metal-lines and the first spiral metal wiring includes about 1 to about 10 isolated sub-metal-lines.

3. The device of claim 1, wherein adjacent sub-metal-lines of the at least two sub-metal-lines have a distance of about 0.001 µm to about 100 µm, and wherein each of the at least two sub-metal-lines has a width of about 0.001 µm to about 100 µm.

4. The device of claim 1, wherein the planar spiral wiring is made of a material including copper or aluminum and wherein the planar spiral wiring has a shape selected from a quadrilateral, hexagonal, octagonal or circular shape.

5. The device of claim 1, wherein the planar spiral wiring has a thickness of about 0.05 µm to about 10 µm and an inner radius of about 5 µm to about 200 µm.

6. The device of claim 1, wherein the second contact layer is disposed on the dielectric layer.

7. The device of claim 1, wherein the planar spiral wiring is made of copper and has a thickness of about 3 µm to about 4 µm and wherein the first spiral metal wiring is made by a single wire.

8. The device of claim 1, wherein, in the planar spiral wiring, the first spiral metal wiring is an outer spiral metal wiring surrounding the second spiral metal wiring as an inner spiral metal wiring, and
   wherein the outer spiral metal wiring comprises a single conductive wire having a width greater than a width of any of the at least two isolated sub-metal-lines of the second spiral metal wiring.

9. An inductor device comprising:
   a semiconductor substrate;
   a first dielectric layer disposed on the semiconductor substrate;
   a first planar spiral wiring disposed on the first dielectric layer;
   one or more second planar spiral wirings disposed over the first planar spiral wiring,
   wherein each planar layer of the first and the one or more second planar spiral wirings includes a first spiral metal wiring and a second spiral metal wiring connected to the first spiral metal wiring only at an end of the second spiral metal wiring, the second spiral metal wiring includes at least two sub-metal-lines isolated with one another and configured in parallel, and the first spiral metal wiring includes at least one sub-metal-line;
   a second dielectric layer disposed between adjacent planar layers of the first and the one or more second planar spiral wirings; and
   a conductive plug disposed through an entire thickness of the second dielectric layer to connect the adjacent planar layers of the first and the one or more second planar spiral wirings such that the first planar spiral wiring is configured in series with the one or more second planar spiral wirings in a different planar layer than a planar layer of the first planar spiral wiring.

10. The device of claim 9, wherein an inner sub-metal-line in the planar layer of one of the first and the one or more second spiral metal wirings is connected to an outer sub-metal-line of an adjacent planar layer of the first and the one or more second spiral metal wirings.

11. The device of claim 9, further comprising a contact layer disposed on the second dielectric layer on a top layer of the one or more second spiral metal wirings, the top layer including an outmost spiral metal wiring connected to the contact layer.

12. The device of claim 9, wherein the at least two insolated sub-metal-lines of the second spiral metal wiring include about 2 to about 10 isolated sub-metal-lines, and wherein the at least one sub-metal-line of the first spiral metal wiring includes about 1 to about 10 isolated sub-metal-lines.

13. The device of claim 9, wherein a distance between adjacent sub-metal-lines in each of the first and the one or more second spiral metal wirings is about 0.001 µm to about 100 µm, and wherein each sub-metal-line has a width of about 0.001 µm to about 100 µm.

14. The device of claim 9, wherein each of the first and the one or more second spiral metal wirings is made of a material including copper or aluminum and wherein the planar spiral wiring has a shape selected from a quadrilateral, hexagonal, octagonal or circular shape.

15. The device of claim 9, wherein each of the first and the one or more second spiral metal wirings has a thickness of about 0.05 µm to about 10 µm and an inner radius of about 5 µm to about 200 µm.

16. The device of claim 9, wherein each of the first and the one or more second spiral metal wirings is made of copper and have a thickness of about 3 µm to about 4 µm and wherein the first spiral metal wiring is made of a single wire.

17. The device of claim 9, wherein, in the planar layer of the first planar spiral wiring, the first spiral metal wiring is an outer spiral metal wiring surrounding the second spiral metal wiring as an inner spiral metal wiring,
   wherein, in a planar layer of a second planar spiral wiring, the second spiral metal wiring is an outer spiral metal wiring surrounding the first spiral metal wiring as an inner spiral metal wiring, and
   wherein an inner sub-metal-line of the inner spiral metal wiring in the planar layer of the first planar spiral wiring is connected to an outer sub-metal-line of the outer spiral metal wiring in the planar layer of the second planar spiral wiring.

* * * * *